(12) United States Patent
Zlotnik et al.

(10) Patent No.: US 11,747,842 B1
(45) Date of Patent: Sep. 5, 2023

(54) MULTI-REFERENCED POWER SUPPLY

(71) Applicant: Micron Technology, Inc., Boise, ID (US)

(72) Inventors: Leon Zlotnik, Camino, CA (US); Leonid Minz, Beer Sheva (IL); Ekram H. Bhuiyan, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/717,599

(22) Filed: Apr. 11, 2022

(51) Int. Cl.
*G05F 1/46* (2006.01)
*G11C 5/14* (2006.01)

(52) U.S. Cl.
CPC ............... *G05F 1/46* (2013.01); *G11C 5/147* (2013.01)

(58) Field of Classification Search
None
See application file for complete search history.

(56) References Cited

U.S. PATENT DOCUMENTS

| | | | |
|---|---|---|---|
| 3,430,070 A | 2/1969 | Marshall, Jr. et al. | |
| 5,179,295 A | 1/1993 | Mattison et al. | |
| 5,448,155 A * | 9/1995 | Jutras | G05F 1/565 363/79 |
| 5,767,717 A | 6/1998 | Schorn et al. | |
| 7,135,842 B2 * | 11/2006 | Banerjee | G05F 1/56 323/280 |
| 7,608,942 B2 * | 10/2009 | Chun | G05F 1/56 307/29 |
| 8,018,170 B2 * | 9/2011 | Chen | H05B 45/325 315/192 |
| 8,390,262 B2 * | 3/2013 | Chang | H05B 45/38 315/250 |
| 8,892,931 B2 * | 11/2014 | Kruglick | G06F 1/3203 713/340 |
| 9,599,672 B2 | 3/2017 | Abhishek et al. | |
| 10,802,564 B2 * | 10/2020 | Yang | H02H 1/0092 |
| 11,171,562 B1 * | 11/2021 | Vilas Boas | G05F 1/575 |
| 11,223,280 B1 * | 1/2022 | Sun | G01R 19/0038 |
| 2006/0294282 A1 | 12/2006 | Warner | |
| 2007/0271473 A1 * | 11/2007 | Hosomi | G06F 1/3203 713/300 |
| 2016/0091915 A1 * | 3/2016 | Hsu | G05F 3/04 327/540 |
| 2018/0081382 A1 * | 3/2018 | Tsao | G05F 1/577 |

* cited by examiner

*Primary Examiner* — Thomas J. Hiltunen
(74) *Attorney, Agent, or Firm* — Brooks, Cameron & Huebsch, PLLC

(57) ABSTRACT

Aspects of the present disclosure are directed to multi-referenced power supplies. One method includes sensing each voltage, via a voltage sensor, of plurality of voltages from different areas of circuit components prior to the voltage reaching a voltage regulator, receiving, at a voltage manager, a sensed voltage magnitude from the voltage sensor, and selecting a feedback voltage to be provided to the voltage regulator based on the sensed voltage magnitude from the voltage sensor for the at least one of the plurality of voltages.

20 Claims, 4 Drawing Sheets

MULTI-REFERENCED POWER SUPPLY

TECHNICAL FIELD

Embodiments of the disclosure relate generally to power supplies, and more specifically, relate to multi-referenced power supplies.

BACKGROUND

A memory system is a system on a chip and as such can have many different sub-systems thereon. Such sub-systems can include digital logic and an associated power supply, voltage control, and clock control, among other sub-systems. A memory sub-system can also be a storage system, storage device, a memory module, or a combination of such. An example of a memory sub-system is a storage system such as a solid-state drive (SSD). These sub-systems need a certain amount of power to perform their designated functions. Accordingly, a power supply is used to power these sub-systems. In some implementations, areas that have a high IR drop (i.e., high current draw) reduce the voltage (V at component=Vreg−IR). So, the Vreg is adjusted (increased) to compensate for the decreased voltage resulting from the increased current at the component. Accordingly, this creates a voltage drop due to the increased current that is undesirable.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
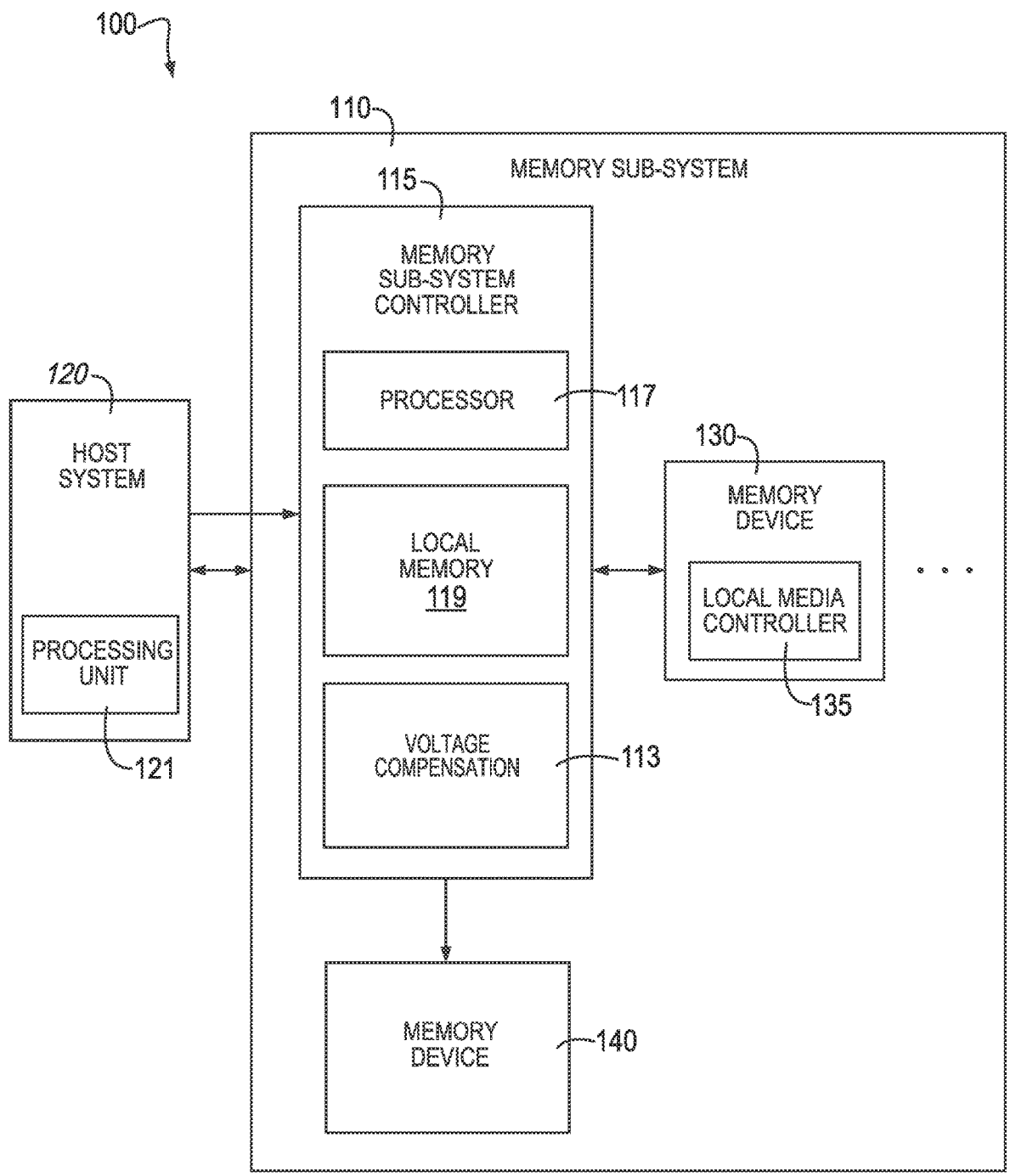
FIG. 1 illustrates an example computing system that includes a memory sub-system in accordance with some embodiments of the present disclosure.

Aspects of the present disclosure are directed to multi-referenced power supplies. In various embodiments as taught in the present disclosure, a multi-referenced system on chip power supply can monitor multiple areas within the system on chip and compensate for IR (i.e., voltage) drop in areas needing assistance with an IR drop.

Such embodiments will be particularly beneficial in implementations where a circuitry area of a system on chip is under a constant load and the voltage regulator cannot compensate for these loads. For example, one circuit area may be close to the regulator and another may be far from the regulator. The far area may have much more resistance due to such things as length of the electrical connection lines, the passing through circuit components like the printed circuit board, internal power grid, or a substrate, and temperature that may be affecting the regulator feedback. Currently, the regulator feedback is provided from a single location. Such a measurement may not be accurate for areas with a resistance load due to physical differences between locations.

These current loads can be determined for each area having a deficiency. These values can be stored in memory and used, for example, to determine the amount of supplemental voltage that is to be provided to each particular area as will be discussed in more detail below. In some implementations, the values stored in memory can be analyzed by machine learning to determine trends in the values, and to further precision the amount of supplemental voltage to provide and the timing of the application of the supplemental voltage to each circuitry area needing supplemental voltage.

As described in more detail herein, aspects of the present disclosure allow for implementation of multi-referenced power supplies. For example, a method of facilitating such a power supply can be accomplished by receiving, to a voltage regulator, a plurality of voltages, each voltage being from a different partition of circuit components, sensing each voltage, via a voltage sensor, prior to the voltage reaching the regulator, receiving, at a voltage manager, a sensed voltage magnitude from the voltage sensor, and selecting a feedback voltage to be provided to the voltage regulator based on the sensed voltage magnitude from the voltage sensor for the at least one of the plurality of voltages.

Examples of partitions include various portions of a memory system such as core logic, which can include the processor and/or local memory. The partitions can also include the memory devices as well as interface circuitry between the memory devices and controller and/or between the controller and the host (i.e., host interface circuitry).

Examples of sub-systems such as storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of a non-volatile memory device is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area that can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states, while a TLC can store multiple bits of information and has eight logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines. While both floating-gate architectures and replacement-gate architectures employ the use of select gates (e.g., select gate transistors), replacement-gate architectures can include multiple select gates coupled to a string of NAND memory cells. Further, replacement-gate architectures can include programmable select gates, while floating-gate architectures generally do not allow for the select gates to be programmed. During operation, a memory sub-system can receive various memory access requests (e.g., requests to read or "retrieve" data and/or requests to write or "program" data to a memory device of the memory sub-system).

FIG. 1 illustrates an example computing system that includes a memory sub-system in accordance with some embodiments of the present disclosure. The memory sub-system 110 of system 100 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing device 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a voltage compensation component 113. Although not shown in FIG. 1 so as to not obfuscate the drawings, the voltage compensation component 113 can include various circuitry to facilitate performance of operations to perform voltage compensation, for example, on various circuit portions of the controller 115, memory devices 130, 140, and/or interfaces thereof. The voltage compensation component 113 can include a regulator and other circuitry such as those described in FIG. 2.

In some embodiments, the memory sub-system controller 115 includes at least a portion of the voltage compensation component 113. For example, the memory sub-system controller 115 can include a processor 117 (processing device) configured to execute instructions stored in local memory 119 for performing the operations described herein. In some embodiments, the voltage compensation component 113 is part of the host system 110, an application, or an operating system.

In some embodiments, the memory sub-system 110, and hence the voltage compensation component 113, can be resident on a mobile computing device such as a smartphone, laptop, phablet, Internet-of-Things device, autonomous vehicle, or the like. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

In a non-limiting example, an apparatus can include a host computing device (e.g., the host system 120) and a processing unit 121 resident on the host computing device. As used herein, the term "resident on" refers to something that is physically located on a particular component. For example, the processing unit 121 being "resident on" the host system 120 refers to a condition in which the hardware circuitry that comprises the processing unit 121 is physically located on the host system 120. The term "resident on" can be used interchangeably with other terms such as "deployed on" or "located on," herein.

Continuing with this example, the processing unit 121 can cause the data to be written to the group of memory cells. At some point after the data has been written to the group of memory cells of the memory device, the processing unit 121 can issue a request to the memory device (e.g., can issue a command to the voltage compensation component 113, the processor 117, and/or the local media controller 135) to read the data from the group of memory cells.

Figure 2:
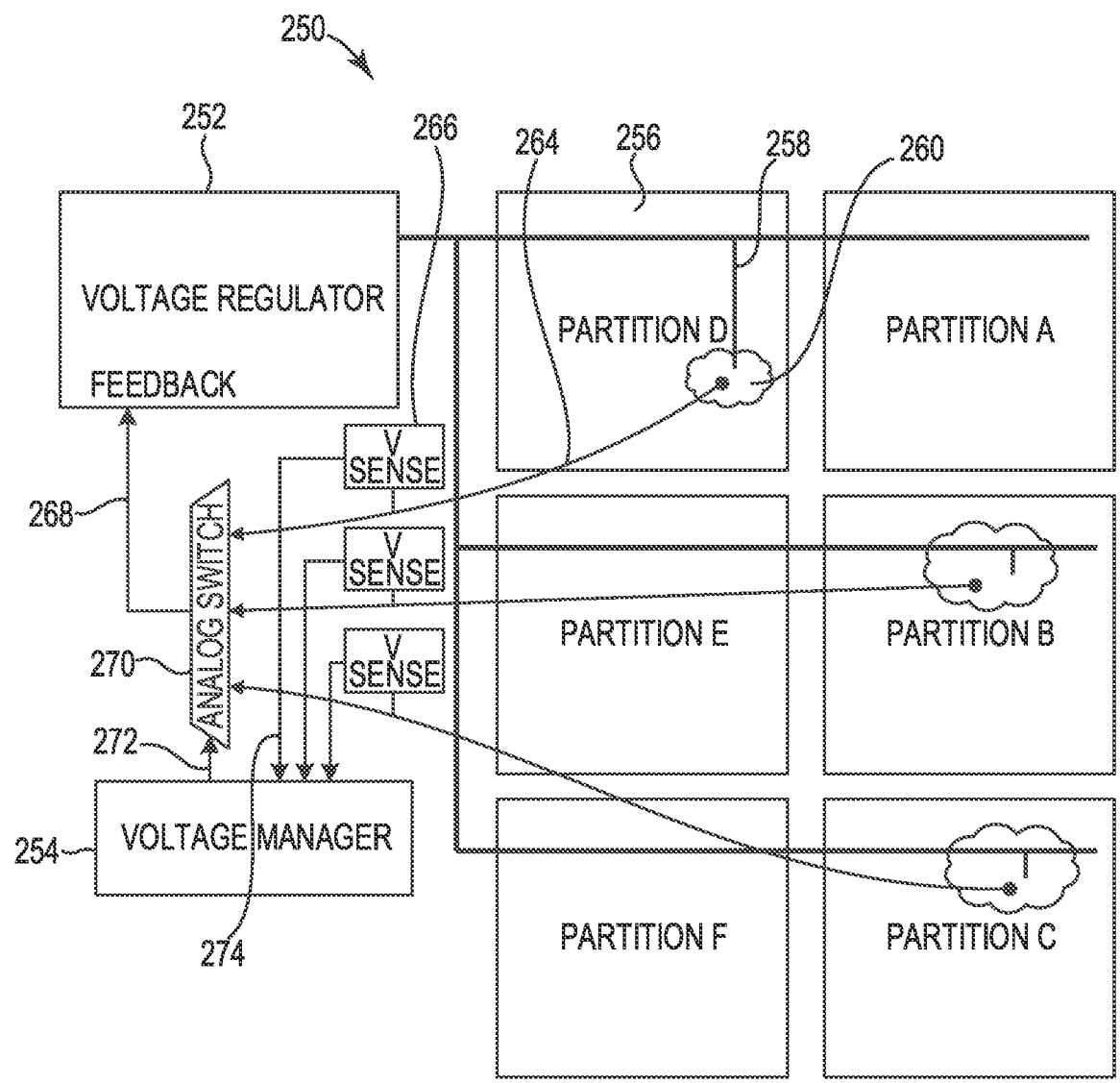
FIG. 2 illustrates a multi-referenced system on chip power supply in accordance with some embodiments of the present disclosure.

FIG. 2 illustrates a multi-referenced system on chip power supply in accordance with some embodiments of the present disclosure. In FIG. 2, the apparatus 250 includes a number of circuit portion areas 256 (e.g., partitions A-F) that have power supplied thereto via a voltage regulator 252 through output lines 258. As shown, these output lines can be connected to areas 260 that may be determined to have or may have the potential to have a power deficiency (current and/or voltage) during operation of the circuitry. The deficient or potentially deficient areas 260 can have supplemental voltage directed to them to keep their voltage level near or above a threshold voltage level. In order to know what supplemental voltage to provide, the areas 260 can be connected, directly or indirectly, to the feedback input 268 of the voltage regulator 252. This can be accomplished by electrical connection lines 264 from areas 260.

The regulator circuitry 252 can also include various other regulator circuitry such as other LDO regulators, buck regulators, boost regulators, buck-boost regulators, etc. Additionally, the embodiments of the present disclosure can be used in any circuit for which voltage adjustment over time may be warranted.

In the example illustrated in FIG. 2, a plurality of areas 260 are being monitored and electrical connection lines are running from those areas to a switch 270. The switch allows the system to select which area supplemental voltage will be provided to. For example, if the area in partition B is selected, then the switch (e.g., directed by the voltage manager 254) connects the electrical connection line connected to partition B to the feedback input 268 of the voltage regulator 252. The system then determines what supplemental voltage is needed and provides that power to bring the voltage level at the area in partition B above a threshold (target) level.

As suggested above, this switching functionality can be accomplished by a voltage manager 254. In such an embodiment, the system can include one sensor of a number of voltage sensors 266 that senses lines 274 sequentially or randomly and provides the reading to the voltage manager 254. In this manner, the voltage can be sensed and that voltage data can be provided via lines 274 to a voltage manager 254. The voltage manager can be a processor, such as processor 117 of FIG. 1, and the voltage compensation component 113 can be the other sensing and supplemental voltage related components shown in FIG. 2. The voltage manager can then provide a signal 272 to the analog switch to select which circuitry area 260 should be connected to the voltage regulator 252.

The voltage manager can provide several functions. For example, as discussed above, the voltage manager 254 can determine which circuitry area 260 should be connected to the voltage regulator 252. This can, for example, be accomplished by comparing the sensed voltages of each circuitry area 260 based on the sensed voltage data taken by sensor 266 and provided via lines 274. The comparison can determine criteria for adjustment of the voltage such as: a threshold voltage level, an average voltage level over a time period, a lowermost voltage, or an uppermost voltage.

One example apparatus (e.g., 250) including such a voltage manager includes a voltage regulator (e.g. 252) configured to provide an output supply voltage to a plurality of circuit portions (e.g., on output lines 258), a plurality of voltage sensors (e.g., 266) configured to sense respective voltages at the plurality of circuit portions (e.g., 260), and a voltage manager (e.g., 254), configured to monitor the respective sensed voltages from the plurality of voltage sensors (e.g., 266) and select, based on a particular criterion, a particular one of the plurality of sensed voltages to be provided as feedback (e.g., 268) to the voltage regulator (e.g., 252) and wherein the voltage regulator is configured to adjust the output supply voltage based on the selected particular one of the plurality of sensed voltages provided as feedback.

In some embodiments, the apparatus further includes a switch (e.g., 270) connected to electrical connections from each different area (e.g., 260) and wherein the switch is electrically connected to the voltage regulator (e.g., 252). In such embodiments, the switch controls which electrical connection from one of the different areas is connected to the voltage regulator. The particular criterion for making the selection of which area should be selected can, for example, be a threshold voltage level, a lowermost voltage, or an uppermost voltage.

In various embodiments, the voltage manager (e.g., 254) is further configured to determine a voltage adjustment from a particular voltage of the plurality of voltages based on a difference of the sensed voltage magnitude of the particular voltage and a target voltage magnitude for the particular voltage. For example, a target voltage and/or threshold voltage can be set by a processor, such as the processor used to facilitate the voltage manager. Such targets/thresholds can be set by an administrator via a user interface, can be programmed by the manufacturer, or set based on the result of processing data via a machine learning functionality.

In some implementations, the voltage manager (e.g., 254) can further be configured to adjust the particular voltage by applying the voltage adjustment quantity to the particular voltage to bring the particular voltage toward the target voltage magnitude.

Figure 3:
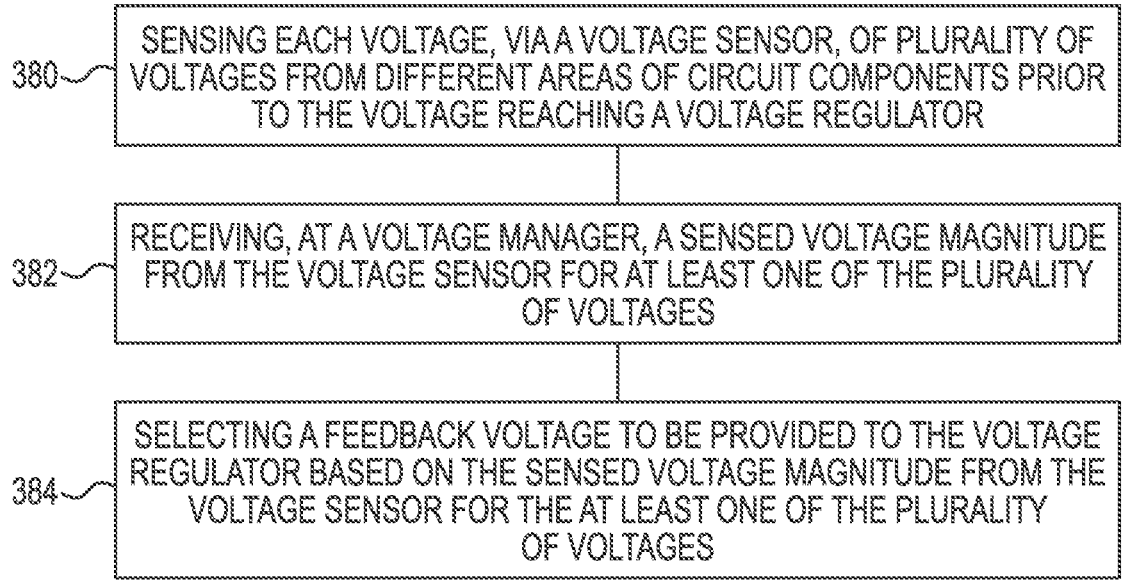
FIG. 3 is a flow diagram corresponding to a method for providing a multi-referenced power supply in accordance with some embodiments of the present disclosure.

FIG. 3 is a flow diagram corresponding to a method for providing a multi-referenced power supply in accordance with some embodiments of the present disclosure. At block 380, the method includes sensing each voltage, via a voltage sensor, of plurality of voltages from different areas of circuit components prior to the voltage reaching a voltage regulator. As discussed herein, the voltage can be received via an electric connection line connected to the partition or connected to the feedback input.

At block 382, the method includes receiving, at a voltage manager, a sensed voltage magnitude from the voltage sensor for at least one of the plurality of voltages. Further, at block 384, the method includes selecting a feedback voltage to be provided to the voltage regulator based on the sensed voltage magnitude from the voltage sensor for the at least one of the plurality of voltages.

As discussed, in some embodiments, the adjustment may be preselected and, in other embodiments, the voltage regulator will determine the voltage adjustment based on the feedback input received. The method can also include adjusting the voltage at the first partition, via the voltage regulator, by applying the voltage adjustment quantity to the voltage to bring the voltage toward the target voltage magnitude.

In some embodiments, the voltage sensor is electrically connected to a wire from the partition to the regulator. Such a connection may also be accomplished by other electric connection line structures, such as circuitry integrated into the system on chip architecture.

In various embodiments, a switch can be provided between the partition and the voltage regulator. The switch can be an analog or digital switch and as discussed herein allows for switching which electric connection line is connected to the feedback input to the voltage regulator.

In some embodiments, an analog sense line is fetched between the partition and the voltage regulator (e.g., when just one partition is being monitored). In other embodiments, an analog sense line can be fetched between the partition and the switch (e.g., as illustrated in FIG. 2).

Figure 4:
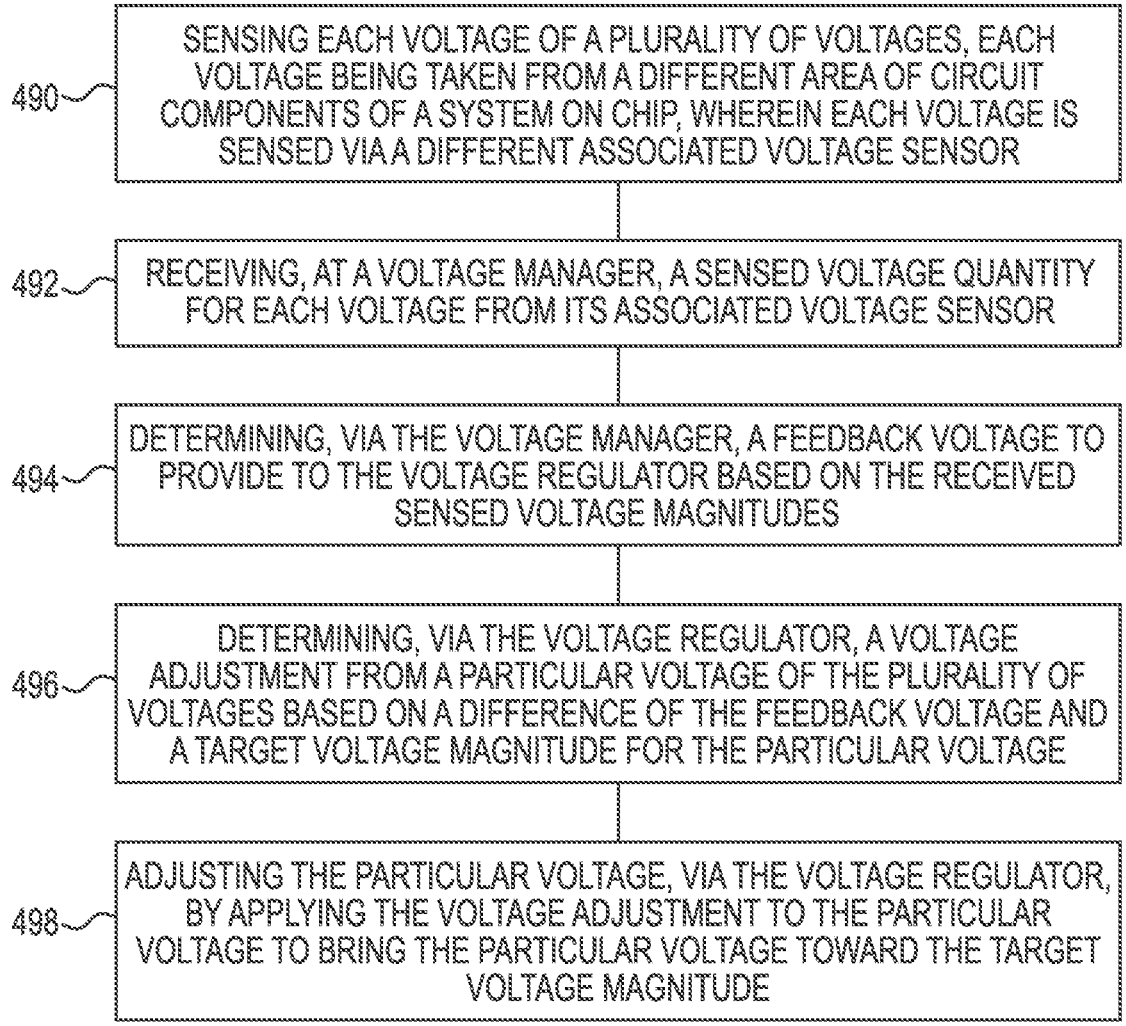
FIG. 4 is another flow diagram corresponding to a method for providing a multi-referenced power supply in accordance with some embodiments of the present disclosure.

FIG. 4 is another flow diagram corresponding to a method for providing a multi-referenced power supply in accordance with some embodiments of the present disclosure. The method includes sensing each voltage of a plurality of voltages, each voltage being taken from a different area of circuit components (e.g., different partitions or areas of a partition of a system on chip), wherein each voltage is sensed via a different associated voltage sensor, at block 490. At block 492, the method includes receiving, at a voltage manager, a sensed voltage magnitude for each voltage from its associated voltage sensor.

The method further includes, at block 494, determining, via the voltage manager, a feedback voltage to provide to the voltage regulator based on the received sensed voltage magnitudes. At block 496, the method includes determining, via the voltage regulator, a voltage adjustment from a particular voltage of the plurality of voltages based on a difference of the feedback voltage and a target voltage magnitude for the particular voltage. The method also includes adjusting the particular voltage, via the voltage regulator, by applying the voltage adjustment to the particular voltage to bring the particular voltage toward the target voltage magnitude, at block 498.

In some embodiments, each different area of the system on chip power supply is within a different partition. In other embodiments, each different area of the system on chip power supply is within a particular partition.

The sensed voltage magnitude can be a digital sensed reading or an analog sensed reading. The embodiments can further include comparing the sensed voltage magnitudes for each voltage to determine a lowest voltage magnitude. This information can then be utilized for selecting the particular voltage based on the lowest voltage magnitude. As the selected lowest voltage is increased to its target voltage, the voltage manager can continue to compare sensed voltages and if a voltage that is sensed is now lower than the selected area, the manager can switch to the area with the lower voltage once the current area being addressed has reached its target voltage.

A similar technique can be used with sensed highest voltages. Such a technique may be beneficial, for example, to limit a system on chip's power or control associated performance.

Embodiments of the present disclosure can be beneficial for implementations where the IR drop is static, as described above. The embodiments of the present disclosure can also be beneficial in providing fast or automatic IR drop compensation for systems exhibiting random or periodic high power consumption behavior through switching to the area exhibiting the lowest voltage magnitude thereby addressing the area with the most need quickly.

The embodiments of the present disclosure remove high voltage supply margins that most system on chip implementations, especially large systems, introduce to make up for IR drop. Such embodiments save power and improve performance which are important benefits in many situations.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
sensing each voltage, via a voltage sensor, of a plurality of voltages sensed from different areas of circuit components within memory partitions of a memory system, prior to each voltage reaching a voltage regulator;
receiving, at a voltage manager, a sensed voltage magnitude from the voltage sensor for at least two of the plurality of voltages;
determining a first particular area of circuit components to provide supplemental voltage to based on a comparison of the sensed voltage magnitudes;
selecting, by the voltage manager, a supplemental voltage that is then provided to the voltage regulator, the supplemental voltage being selected based on the sensed voltage magnitude from the voltage sensor for the at least one of the plurality of voltages; and
as the selected first particular area voltage is increased to a target voltage, via the supplemental voltage, the voltage manager continues to compare sensed voltage magnitudes from different areas of circuitry components and if a different second particular area voltage that is sensed is now lower than the selected first particular area, the voltage manager can switch to the different second particular area with the lower voltage once the current first particular area being addressed has reached its target voltage.

2. The method of claim 1, wherein the voltage sensor is electrically connected to a wire from one of the partitions to the voltage regulator.

3. The method of claim 1, wherein a switch is provided between one of the partitions and the voltage regulator.

4. The method of claim 3, wherein the switch is an analog switch.

5. The method of claim 1, wherein an analog sense line is fetched between one of the partitions and the voltage regulator.

6. The method of claim 1, wherein an analog sense line is fetched between one of the partitions and the switch.

7. A method comprising:
sensing each voltage of a plurality of voltages, each sensed voltage being taken from a different area of circuit components, wherein each voltage is sensed via an associated voltage sensor;
receiving, at a voltage manager, a sensed voltage magnitude for each voltage from its associated voltage sensor;
determining a first particular area of circuit components to provide supplemental voltage to based on a comparison of the sensed voltage magnitudes;
determining, via the voltage manager, a supplemental voltage to provide to the voltage regulator, the supplemental voltage being selected based on the received sensed voltage magnitudes;
providing, via the voltage manager, the determined supplemental voltage to the voltage regulator;
determining, via the voltage regulator, a voltage adjustment from a particular voltage of the plurality of voltages based on a difference of the feedback voltage and a target voltage magnitude for the particular voltage; and
adjusting the particular voltage, via the voltage regulator, by applying the voltage adjustment to the particular voltage to bring the particular voltage toward the target voltage magnitude; and
as the selected first particular area voltage is increased to a target voltage, via the supplemental voltage, the voltage manager continues to compare sensed voltage magnitudes from different areas of circuitry components and if a different second particular area voltage that is sensed is now lower than the selected first particular area, the voltage manager can switch to the different second particular area with the lower voltage once the current first particular area being addressed has reached its target voltage.

8. The method of claim 7, wherein each different area is within a different partition.

9. The method of claim 7, wherein each different area is within a particular partition.

10. The method of claim 7, wherein the sensed voltage magnitude is a digital sensed reading.

11. The method of claim 7, wherein the sensed voltage magnitude is an analog sensed reading.

12. The method of claim 7, further comprising comparing the sensed voltage magnitudes for each voltage to determine a lowest voltage magnitude.

13. The method of claim 12, further comprising selecting the particular voltage based on the lowest voltage magnitude.

14. An apparatus, comprising:
a voltage regulator configured to provide an output supply voltage to a plurality of circuit portions;
a plurality of voltage sensors configured to sense respective voltages at the plurality of circuit portions; and
a voltage manager, configured to:
monitor the respective sensed voltages from the plurality of voltage sensors;
determine a first particular area of circuit components to provide supplemental voltage to based on a comparison of the sensed voltage magnitudes;
select, based on a particular criterion, a particular one of the plurality of sensed voltages to be provided as a supplemental voltage to the voltage regulator, and
wherein the voltage regulator is configured to adjust the output supply voltage based on the selected particular one of the plurality of sensed voltages provided as feedback from the voltage manager; and
as the selected first particular area voltage is increased to a target voltage, via the supplemental voltage, the voltage manager continues to compare sensed voltage magnitudes from different areas of circuitry components and if a different second particular area voltage that is sensed is now lower than the selected first particular area, the voltage manager can switch to the different second particular area with the lower voltage once the current first particular area being addressed has reached its target voltage.

15. The apparatus of claim 14, wherein the apparatus further includes a switch connected to electrical connections from each of the plurality of circuit portions and wherein the switch is electrically connected to the voltage regulator.

16. The apparatus of claim 15, wherein the switch controls which electrical connection from one of the plurality of circuit portions is connected to the voltage regulator.

17. The apparatus of claim 14, wherein the voltage manager is further configured to determine a voltage adjustment from a particular voltage of the plurality of voltages based on a difference of the sensed voltage magnitude of the particular voltage and a target voltage magnitude for the particular voltage.

18. The apparatus of claim 17, wherein the voltage manager is further configured to adjust the particular voltage by applying the voltage adjustment quantity to the particular voltage to bring the particular voltage toward the target voltage magnitude.

19. The apparatus of claim 14, wherein the particular criterion is a threshold voltage level.

20. The apparatus of claim 14, wherein the particular criterion is a lowermost or an uppermost voltage.

* * * * *